US012733360B2

(12) United States Patent
Han et al.

(10) Patent No.: US 12,733,360 B2
(45) Date of Patent: Sep. 8, 2026

(54) DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Linhong Han, Beijing (CN); Tinghua Shang, Beijing (CN); Pengfei Yu, Beijing (CN); Shun Zhang, Beijing (CN); Yang Zhou, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 18/488,449

(22) Filed: Oct. 17, 2023

(65) Prior Publication Data

US 2024/0049538 A1 Feb. 8, 2024

Related U.S. Application Data

(63) Continuation-in-part of application No. 17/265,293, filed as application No. PCT/CN2020/084678 on Apr. 14, 2020, now Pat. No. 12,016,217.

(51) Int. Cl.
*H10K 59/131* (2023.01)

(52) U.S. Cl.
CPC .................................. *H10K 59/131* (2023.02)

(58) Field of Classification Search
CPC .... H10K 59/131; H10K 71/70; H10K 77/111; H10K 2102/311; G09G 3/006;
(Continued)

(56) References Cited

U.S. PATENT DOCUMENTS 9,922,585 B2 * 3/2018 Kim ....................... G09G 3/006
12,016,217 B2 * 6/2024 Han ...................... H01L 25/167
(Continued)

FOREIGN PATENT DOCUMENTS

CN 203324610 U 12/2013
CN 107742477 A 2/2018
(Continued)

OTHER PUBLICATIONS

Chinese Patent Application No. 202080000527.8, Notice of First Review Opinion, dated May 11, 2022.
(Continued)

*Primary Examiner* — Natalia A Gondarenko
(74) *Attorney, Agent, or Firm* — DINSMORE & SHOHL LLP

(57) ABSTRACT

The present disclosure provides a display panel and a display device. The display panel includes: a display substrate, an integrated circuit chip and a circuit board. The display substrate includes a substrate, a first bonding portion, a second bonding portion, and a first connection line, wherein: the first bonding portion includes a plurality of first pins including a first detection pin and a second detection pin; the second bonding portion include a plurality of second pins including a first connection pin electrically connected to the first detection pin and a second connection pin electrically connected to the second detection pin; the first connection line connects the first connection pin to the second connection pin, and includes a first crack detection line; the integrated circuit chip is bonded to the first bonding portion; and the circuit board is bonded to the second bonding portion.

18 Claims, 7 Drawing Sheets

(58) Field of Classification Search

CPC .......... G09G 3/03; G09G 3/035; G09G 3/025; G09G 2300/0426; G09G 2300/0452; G09G 2330/12; H10P 74/00; H10P 74/20; H10P 74/203; H10P 74/207; H10P 74/23; H10P 74/232; H10P 74/235; H10P 74/238; H10P 74/27; H10P 74/273; H10P 74/277; H10D 86/441; H10D 86/443; H10D 86/481; H10D 86/60; H10H 29/012; H10H 29/0364; H10H 29/10; H10H 29/30; H10H 29/34; H10H 29/352; H10H 29/362; H10H 29/39; G09F 9/33; G09F 9/335; G09F 9/35; G09F 9/301; H01L 22/12; H01L 22/32; H01L 22/34; H05K 1/189; H05K 3/323; H10W 72/90; H10W 72/921; H10W 72/922; H10W 72/9223; H10W 72/9226; H10W 72/923; H10W 72/9232; H10W 72/924; H10W 72/925; H10W 72/926; H10W 72/927; H10W 72/931; H10W 72/932; H10W 72/934; H10W 72/936; H10W 72/941; H10W 72/9413; H10W 72/9415; H10W 72/942; H10W 72/944; H10W 72/9445; H10W 72/951; H10W 72/952; H10W 72/953; H10W 72/957; H10W 72/9524; H10W 72/9528; H10W 72/961; H10W 72/963; H10W 72/965; H10W 72/967; H10W 72/981; H10W 72/983; H10W 72/985; H10W 72/987

USPC ............................................................ 257/40

See application file for complete search history.

(56) References Cited

U.S. PATENT DOCUMENTS

2009/0121229 A1* 5/2009 Saitou .................... H10D 86/00 257/E27.06
2014/0267683 A1 9/2014 Bibl et al.
2016/0133684 A1* 5/2016 Cho ....................... H10D 86/60 438/23
2016/0232826 A1* 8/2016 Cho ..................... H10K 59/131
2017/0031199 A1* 2/2017 Kimura ............... G02F 1/13452
2017/0270842 A1* 9/2017 Nam ....................... G09G 3/006
2018/0053455 A1* 2/2018 Zhang .................. H10K 77/111
2018/0158741 A1* 6/2018 Kim ....................... G09G 3/006
2018/0158894 A1* 6/2018 Park ..................... H10K 59/131
2018/0174505 A1* 6/2018 Mandlik .............. G09G 3/3266
2019/0057632 A1 2/2019 Kim et al.
2019/0066595 A1 2/2019 Kim et al.
2019/0213935 A1* 7/2019 Jung ...................... H10K 59/35
2020/0371627 A1 11/2020 Luo et al.
2021/0247859 A1 8/2021 Gong et al.

FOREIGN PATENT DOCUMENTS

| | | | |
|---|---|---|---|
| CN | 108154800 | A | 6/2018 |
| CN | 108762562 | A | 11/2018 |
| CN | 108922909 | A | 11/2018 |
| CN | 109256045 | A | 1/2019 |
| CN | 109375399 | A | 2/2019 |
| CN | 109427273 | A | 3/2019 |
| CN | 109427752 | A | 3/2019 |
| CN | 109739386 | A | 5/2019 |
| CN | 110634411 | A | 12/2019 |
| EP | 3330951 | A2 | 6/2018 |
| EP | 3435434 | A2 | 1/2019 |
| EP | 3457822 | A1 | 3/2019 |
| EP | 3186835 | B1 | 9/2020 |
| EP | 3806076 | A1 | 4/2021 |
| KR | 1020070111717 | | 11/2007 |
| WO | 2019235823 | A1 | 12/2019 |

OTHER PUBLICATIONS

Chinese Patent Application No. 202080000527.8, Rejection, dated Nov. 1, 2022.

International Application No. PCT/CN2020/084678, International Search Report, mailed Jan. 20, 2021.

International Application No. PCT/CN2020/084678, Written Opinion of the International Searching Authority, mailed Jan. 20, 2021.

U.S. Appl. No. 17/265,293, Notice of Allowance, mailed Jul. 7, 2023.

* cited by examiner

DISPLAY PANEL AND DISPLAY DEVICE

CROSS-REFERENCE TO RELATED APPLICATION

The present application is a continuation-in-part of U.S. patent application Ser. No. 17/265,293, filed on Feb. 2, 2021, which is the U.S. National State Application under U.S.C. § 371 of International Patent Application No. PCT/CN2020/084678, filed on Apr. 14, 2020, the disclosure of both which are incorporated by reference herein in its entirety.

TECHNICAL FIELD

The present disclosure relates to the field of display technology, and in particular to a display panel and a display device.

BACKGROUND

With the advantages such as light weight and thin size, bendability, low power consumption, wide color gamut, and high contrast, the organic light-emitting display device is listed as a next-generation display technology with a significant development prospect. The production yield of the organic light-emitting display panel is a key problem that restricts a large-scale application of the organic light-emitting display device.

SUMMARY

According to one aspect of the embodiments of the present disclosure, a display panel is provided. The display panel includes: a display substrate including a display area and a non-display area surrounding the display area, wherein the display substrate includes a substrate, as well as a first bonding portion, a second bonding portion, and a first connection line, which are located on one side of the substrate and located in the non-display area, wherein: the first bonding portion includes a plurality of first pins including a first detection pin and a second detection pin; the second bonding portion is located on one side of the first bonding portion away from the display area, the second bonding portion includes a plurality of second pins including a first connection pin and second connection pin, the first detection pin is electrically connected to the first connection pin, and the second detection pin is electrically connected to the second connection pin; the first connection line connects the first connection pin to the second connection pin, and includes a first crack detection line arranged around at least a portion of edges of the display area; and an integrated circuit chip bonded to the first bonding portion, and configured to drive the display substrate to display according to a signal of a main board, and to determine whether there is a crack on an edge of the display substrate according to electric signals of the first detection pin and the second detection pin; and a circuit board bonded to the second bonding portion and configured to transmit a signal of the main board to the integrated circuit chip.

In some embodiments, the second bonding portion further includes a third connection pin and a fourth connection pin, wherein the third connection pin is connected with the first detection pin through an internal pin and connected with the first connection pin through a connecting wire, and the fourth connection pin is connected with the second detection pin through an internal pin and connected with the second connection pin through a connecting wire.

In some embodiments, the first connection pin and the second connection pin are respectively located at end regions on both sides of the second bonding portion, and the third connection pin and the fourth connection pin are both located between the first connection pin and the second connection pin.

In some embodiments, the connecting wire is independently arranged relative to the circuit board.

In some embodiments, the display panel further includes: cell test circuit, located between the display area and the integrated circuit chip, wherein an interval region is provided between the cell test circuit and the integrated circuit chip in a direction away from the display area, and the first crack detection line includes a first detection portion passing through the interval region.

In some embodiments, the first crack detection line further includes a second detection portion arranged around a first portion of edges of the display area and a third detection portion arranged around a second portion of edges of the display area, the first portion of edges does not overlap with the second portion of edges or partially overlap with the second portion of edges, and the second detection portion and the third detection portion are respectively connected with both ends of the first detection portion on opposite sides of the interval region.

In some embodiments, the display substrate includes: a semiconductor layer, a first insulation layer, a first gate metal layer, a second insulation layer, and a second gate metal layer, a third insulation layer and a data metal layer located on one side of the substrate and arranged sequentially along a direction away from the substrate; and the first detection portion is located in the data metal layer.

In some embodiments, the substrate is a flexible substrate, the display area is substantially polygonal, and the first bonding portion is adjacent to one side of the display area; the display substrate further includes a bending portion located on one side of the substrate and between the display area and the cell test circuit.

In some embodiments, the first connection line includes a second lead wire connecting one end of the first crack detection line to the first connection pin, and a fourth lead wire connecting another end of the first crack detection line to the second connection pin, wherein orthographic projections of the second lead wire and the fourth lead wire do not overlap with an orthographic projection of the first bonding portion on the substrate.

In some embodiments, the display substrate includes: a semiconductor layer, a first insulation layer, a first gate metal layer, a second insulation layer, and a second gate metal layer, a third insulation layer and a data metal layer located on one side of the substrate and arranged sequentially along a direction away from the substrate; the first pin includes: a first transmission sub-layer located in the first gate metal layer, and a second transmission sub-layer located in the data metal layer and connected to the first transmission sub-layer through a via hole; and the second pin includes a single-layer transmission portion located in the data metal layer.

In some embodiments, the second lead wire and the fourth lead wire are located in the second gate metal layer, the second lead wire is connected to the first connection pin through a via hole, and the fourth lead wire is connected to the second connection pin through a via hole.

In some embodiments, the first crack detection line includes a plurality of first detection sections and a plurality of second detection sections that are alternately provided, wherein the first detection section is located in the second gate metal layer, the second detection section is located in the data metal layer, and the first detection section is connected to the second detection section through a via hole.

In some embodiments, the display area is substantially polygonal, the first bonding portion is adjacent to one side of the display area, and at least one of the second detection sections is adjacent to a corner of the display area.

In some embodiments, the second bonding portion is connected to the first bonding portion by a plurality of internal pins which are located in the data metal layer; the plurality of second pins further include a first external test pin and a second external test pin, wherein the first external test pin is connected to the first test pin through one internal pin, and the second external test pin is connected to the second test pin through one internal pin.

In some embodiments, the second detection portion surrounding the first portion of edges of the display area is in a roundabout shape; and/or, the third detection portion surrounding the second portion of edges of the display area is in a roundabout shape.

In some embodiments, at least a portion of the first crack detection line extends in a wave form.

In some embodiments, the second detection portion and the third detection portion have substantially the same length.

According to another aspect of the embodiments of the present disclosure, a display device is provided. The display device includes: the display panel according to any one of the foregoing embodiments.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
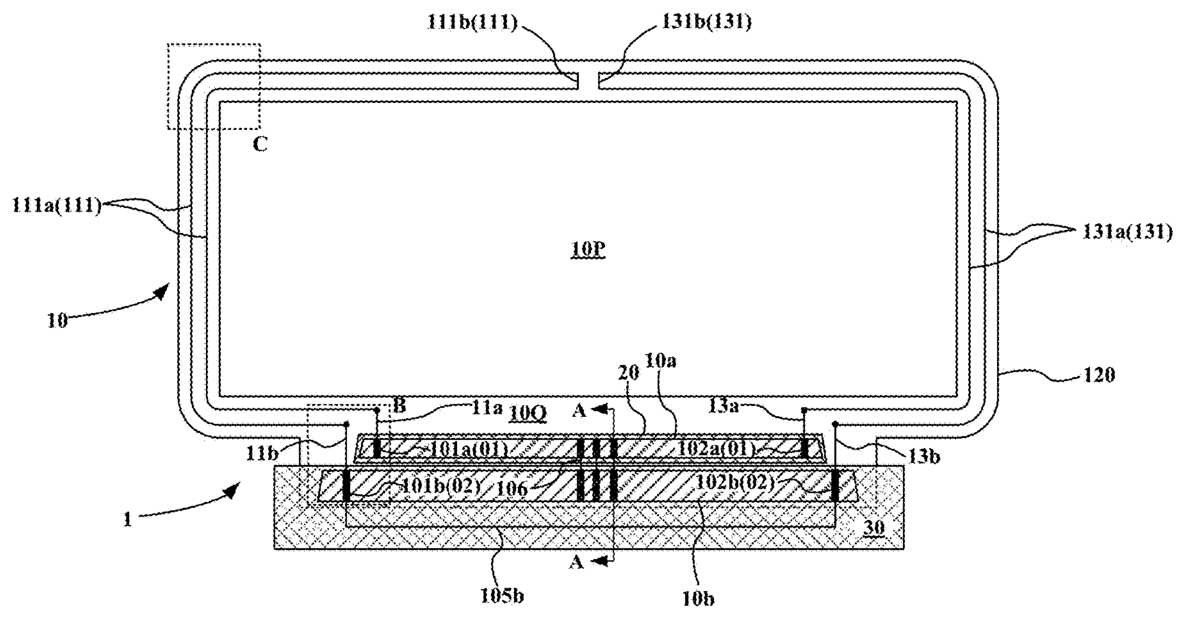
FIG. 1 is a front view of a display panel according to one embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The words “first”, “second”, and similar words used in the present disclosure do not denote any order, quantity or importance, but merely serve to distinguish different parts. Such similar words as “comprise/include” or “contain” mean that the element preceding the word encompasses the elements enumerated after the word, and does not exclude the possibility of encompassing other elements as well. The terms “up”, “down”, “left”, “right”, or the like are used only to represent a relative positional relationship, and the relative positional relationship may also be changed correspondingly if the absolute position of the described object changes.

In the present disclosure, when it is described that a particular member is located between the first member and the second member, there may be an intermediate member between the particular member and the first member or the second member, and alternatively, there may be no intermediate member. When it is described that a particular member is connected to other members, the particular member may be directly connected to said other members without an intermediate member, and alternatively, may not be directly connected to said other members but with an intermediate member.

Unless otherwise specifically defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

With the characteristics such as light weight, thin size and flexibility, the organic light-emitting display panel is widely applied in a flexible display device product. Moisture and oxygen in the air are main factors affecting the service life of the organic light-emitting display panel. In one related technology, a Thin Film Encapsulation (TFE) technology is used to encapsulate and protect a substrate containing an organic light-emitting device and its driving circuit to prevent intrusion of moisture and oxygen.

During the process of implementing the embodiments of the present disclosure, the inventors of the present disclosure have noticed that, during the production process of the organic light-emitting display panel, a crack might have been produced at an edge. If the crack is not checked out in time, a direct consequence is that moisture and oxygen intrude the display area, which causes malfunction of the organic light-emitting device. To solve this technical problem, the embodiments of the present disclosure provide a display panel and a display device. In the following various embodiments of the present disclosure, a connection refers to an electrical connection.

As shown in FIG. 1, the display panel 1 provided by one embodiment of the present disclosure includes: a display substrate 10, an integrated circuit chip 20 (IC) and a circuit board 30.

The display substrate 10 includes a display area 10P and a non-display area 10Q surrounding the display area 10P. The display substrate 10 includes a substrate 120, and a first bonding portion 10*a*, a second bonding portion 10*b*, a first connection line, and a second connection line located on one side of the substrate 120 and located in the non-display area 10Q. The first bonding portion 10*a* includes a plurality of first pins 01 including a first detection pin 101*a* and a second detection pin 102*a*; and the second bonding portion 10*b* is located on one side of the first bonding portion 10*a* away from the display area 10P and connected to the first bonding portion 10*a*. The second bonding portion 10*b* includes a plurality of second pins 02 including a first connection pin 101*b* and a second connection pin 102*b*. The first connection line connects the first detection pin 101*a* to the first connection pin 101*b*, and includes a first crack detection line 111 arranged around at least a portion of edges of the display area 10P; and the second connection line connects the second detection pin 102*a* to the second connection pin 102*b*.

The integrated circuit chip 20 is bonded to the first bonding portion 10*a*, and configured to drive the display substrate 10 to display according to a signal of a main board, and determine whether there is a crack on an edge of the substrate 10 according to electrical signals of the first detection pin 101*a* and the second detection pin 102*a*.

The circuit board 30 is bonded to the second bonding portion 10*b* for transmitting a signal of the main board to the IC 20. The circuit board 30 includes a connection wire 105*b*, which connects the first connection pin 101*b* to the second connection pin 102*b*.

Figure 2A:
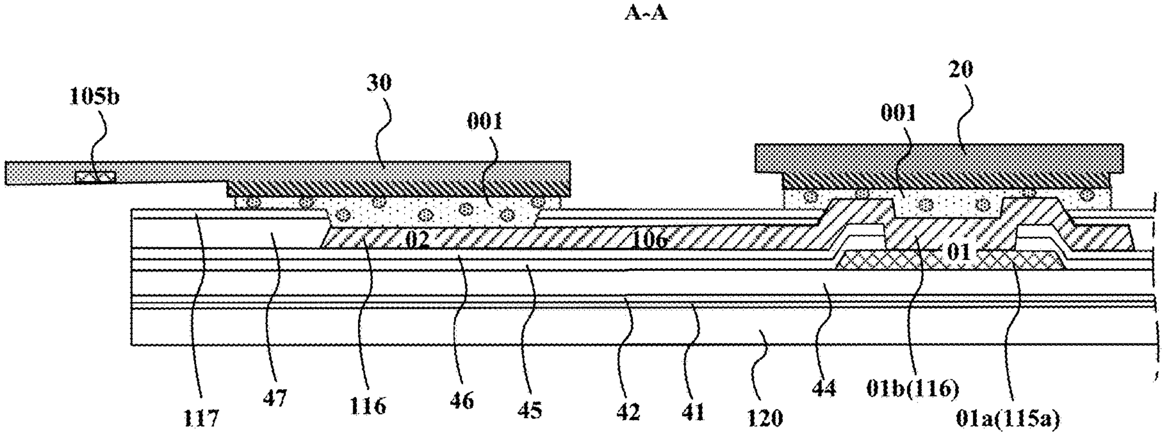
FIG. 2*a* is a schematic cross-sectional view taken along an A-A direction of the display panel shown in FIG. 1.

The display area 10P of the display substrate 10 is configured to display an image, and the non-display area 10Q of the display substrate 10 is configured to arrange a related circuit and a related electronic element so as to support the display of the display area 10P. In the embodiments of the present disclosure, the first bonding portion 10*a* of the display substrate 10 includes a plurality of first pins 01 which are bonded (i.e., linked) in a one-to-one correspondence with the plurality of pins of the IC 20, thereby implementing transmitting an electrical signal between the first bonding portion 10*a* and the IC 20. Similarly, the second bonding portion 10*b* of the display substrate 10 includes a plurality of second pins 02 which are bonded in a one-to-one correspondence with the plurality of pins of the circuit board 30, thereby implementing transmitting an electrical signal between the second bonding portion 10*b* and the circuit board 30. Some second pins 02 of the second bonding portion 10*b* may be connected to some first pins 01 of the first bonding portion 10*a* through an internal pin (also referred to as ILB) 106, thereby implementing transmitting an electrical signal between the second bonding portion 10*b* and the first bonding portion 10*a*. The circuit board 30 is connected to the main board (not shown) of the display device, so that the signal of the main board may be transmitted to the IC 20 through the second bonding portion 10*b* and the first bonding portion 10*a*. The circuit board 30 is, for example, a flexible printed circuit (FPC). The main function of the IC 20 is to provide a driving signal, a data signal, a clock signal and the like to the display area 10P according to a signal of the main board, thereby driving the display substrate 10 to display. As shown in FIGS. 1 and 2*a*, in some embodiments of the present disclosure, the bonding between the pin of the IC 20 and the first pin 01 of the first bonding portion 10*a*, and the bonding between the pin of the circuit board 30 and the second pin 02 of the second bonding portion 10*b* are implemented by a conductive adhesive film 001. The conductive adhesive film 001 is, for example, an anisotropic conductive film (ACF).

In the embodiments of the present disclosure, the specific shape of the display area 10P of the display substrate 10 is not limited, such as circular, elliptical, polygonal, or the like. In some embodiments of the present disclosure, the display area 10P is substantially polygonal, for example, substantially rectangular as shown in FIG. 1. The first bonding portion 10*a* is adjacent to one of the sides of the display area 10P. For example, the first bonding portion 10*a* is adjacent to one of the long sides of the substantially rectangular display area 10P. The second bonding portion 10*b* is located on one side of the first bonding portion 10*a* away from the display area 10P. The display area is substantially polygonal, and it may be understood that: the shape of the display area is polygon after ignoring a round chamfer, a bevel chamfer, or a process error of the display area.

Figure 2B:
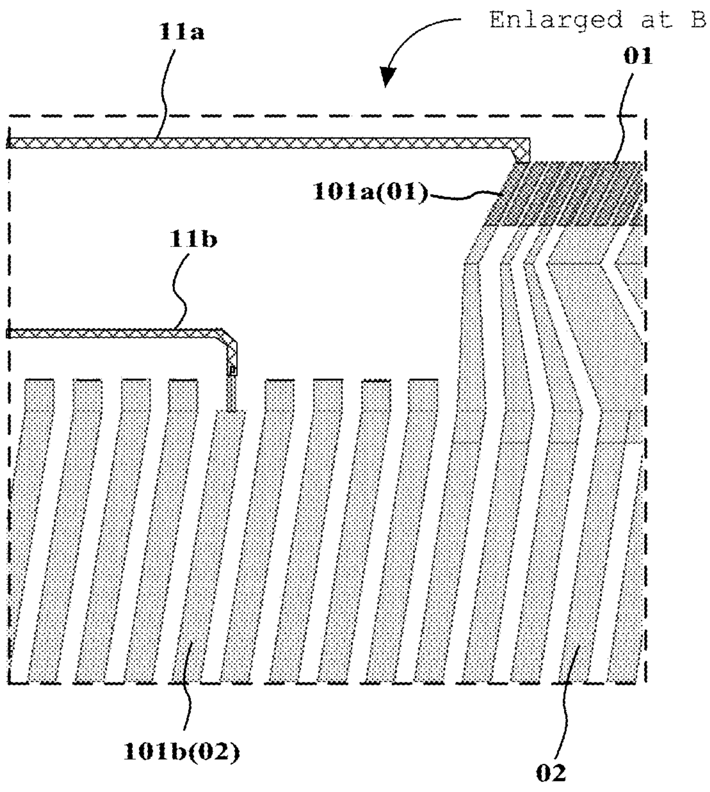
FIG. 2*b* is a partially enlarged schematic view of B of the display panel shown in FIG. 1.

In some embodiments of the present disclosure, the display substrate 10 is an active matrix organic light-emitting diode (AMOLED) display substrate. As shown in FIG. 2*d*, the pixel structure of the display area 10P of the AMOLED display substrate includes an organic light emitting device 121, a thin film transistor device 122, and a capacitive device 123. Each organic light emitting device 121 which is controlled by the thin film transistor device 122, may emit light independently and continuously. In some other embodiments of the present disclosure, the display substrate may also be a passive matrix organic light-emitting diode (PMOLED) display substrate. The display principle of the PMOLED display substrate is to light up the organic light-emitting devices arranged in an array in the display area in a scanning manner, so that each organic light-emitting device instantly emits light under a short pulse.

In some embodiments of the present disclosure, the display substrate 10 is an AMOLED display substrate, wherein the substrate 120 thereof may be a flexible substrate or a hard substrate, and the specific material type of the substrate 120 is not limited. For example, in some embodiments, the substrate 120 is a flexible substrate, and the material of the substrate includes polyimide. In other embodiments, the substrate 120 is a hard substrate, and the material includes glass or resin.

As shown in FIGS. 2*a* and 2*d*, in some embodiments of the present disclosure, the structure of the AMOLED display substrate includes: a barrier layer 41, a buffer layer 42, a semiconductor layer 43, a first insulation layer 44, a first gate metal layer 115*a*, a second insulation layer 45, a second gate metal layer 115*b*, a third insulation layer 46, a data metal layer 116, a flat layer 47, an anode layer 48, a pixel defining layer 49, an organic functional layer 50, a cathode layer 51 and an encapsulation layer 117 that are located on one side of the substrate 120 and sequentially arranged along a direction away from the substrate 120. The encapsulation layer 117 exposes a plurality of first pins 01 of the first bonding portion 10*a* and a plurality of second pins 02 of the second bonding portion 10*b*. In some embodiments of the present disclosure, the display panel is a touch display panel, and the display substrate further includes a touch structure layer located on one side of the encapsulation layer away from the substrate.

In the embodiments of the present disclosure, in addition to providing a display-related signal to the display area 10P, the IC 20 is also configured to determine whether there is a crack on an edge of the display substrate 10 according to electrical signals of the first detection pin 101*a* and the second detection pin 102*a* such as a potential difference. As shown in FIG. 1, the first detection pin 101*a*, the first connection line, the first connection pin 101*b*, the connection line 105*b*, the second connection pin 102*b*, the second connection line and the second detection pin 102*a* are sequentially connected to form a crack detection circuit, wherein the first crack detection line 111 included in the first connection line is arranged around at least a portion of edges of the display area 10P. If there is a crack on an edge of the substrate 10, the first crack detection line 111 is also very likely to produce a crack or even a break under the action of a crack stress. The resistance value of the first crack detection line 111 may increase greatly after a crack occurs, and the crack detection circuit may suffer from open-circuit after the first crack detection line 111 is broken. Therefore, by detecting the electrical signals of the first detection pin 101*a* and the second detection pin 102*a*, it may be substantially determined whether there is a crack on an edge of the display substrate 10. In the production stage of the display panel, by timely screening out defective products with cracks, it is possible to improve the product quality of the display device and avoid a large amount of waste of manpower and materials.

As shown in FIG. 1, in some embodiments of the present disclosure, the first connection line includes a first crack detection line 111 surrounding a first portion of edges of the display area 10P, and the second connection line includes a second crack detection line 131 surrounding a second portion of edges of the display area 10P, wherein there is no overlap between the first portion and the second portion of edges of the display area 10P. The greater the length of an edge of the display area 10P surrounded by the crack detection line is, that is, the greater the sum of length of the first portion of edge and length of the second portion of edge of the display area 10P is, the more accurate the detection of a crack on an edge of the display substrate 10 by the IC 20 will be.

As shown in FIG. 1, the first connection line includes a first lead wire 11*a* connecting one end of the first crack detection line 111 and the first detection pin 101*a*, and second lead wire 11*b* connecting another end of the first crack detection line 111 and the first connection pin 101*b*, wherein an orthographic projection of the second lead wire 11*b* does not overlap with an orthographic projection of the first bonding portion 10*a* on the substrate 120. Similarly, the second connection line includes a third lead wire 13*a* connecting one end of the second crack detection line 131 and the second detection pin 102*a*, and a fourth lead wire 13*b* connecting another end of the second crack detection line 131 and the second connection pin 102*b*, wherein an orthographic projection of the fourth lead wire 13*b* does not overlap with an orthographic projection of the first bonding portion 10*a* on the substrate 120.

Since the IC 20 is required to provide many signals such as a driving signal, a data signal, and a clock signal to the display area 10P, the structural design of the first bonding portion 10*a* is more complicated than that of the second bonding portion 10*b*. In addition, in order to reliably connect the IC 20 and the first bonding portion 10*a*, the external force required to be applied is relatively large when the IC 20 is bonded to the first bonding portion 10*a*. During the process of implementing the embodiments of the present disclosure, the inventors of the present disclosure have discovered that, if a part of trace of the crack detection circuit of the display panel passes through the IC bonding portion along a length direction of the IC bonding portion, then this portion of trace is also required to avoid a pin on the IC bonding portion by a jumper design. In this way, the structural complexity and manufacturing difficulty of the IC bonding portion are doubled, so that not only it is likely to produce a poor process with a high process cost, but also it is possible to increase the possibility that the circuit structure is damaged due to a bonding stress.

In the embodiments of the present disclosure, in addition that the first detection pin 101*a* and the second detection pin 102*a* of the crack detection circuit are arranged in the first bonding portion 10*a*, its trace structure is substantially arranged outside an area in which the first bonding portion 10*a* is situated, and the connection wire 105*b* as a part of the crack detection circuit is also arranged on the circuit board 30. The first detection pin 101*a* and the second detection pin 102*a* have similar structures to other first pins. Therefore, compared with the above-described related technologies, the embodiments of the present disclosure may reduce the structural complexity and manufacturing difficulty of the first bonding portion 10*a*, thereby reducing the occurrence of a poor process, reducing the process cost, and reducing possibility that the circuit structure is damaged due to a bonding stress.

In addition, in the embodiments of the present disclosure, the trace structure of the crack detection circuit is substantially arranged outside the area where the first bonding portion 10*a* is situated, which also greatly increases the degree of freedom of the trace design so that a projection position of the trace on the substrate 120, a material of the trace, and a layer position of the trace may be selected flexibly. Therefore, it is more favorable for optimizing an electrical performance of the display substrate.

As shown in FIG. 1, an orthographic projection of the connection wire 105*b* on the circuit board 30 does not overlap with an orthographic projection of the second bonding portion 10*b* on the substrate 120. In other words, after the circuit board 30 is bonded to the second bonding portion 10*b*, the connection wire 105*b* is located outside the area where the second bonding portion 10*b* is situated, and the connection wire 105*b* is substantially not affected by a bonding force, which makes a more reliable connection between the circuit board 30 and the second bonding portion 10*b*. Moreover, there is also a higher flexibility in the layer position of the connection wire 105*b* on the circuit board 30 and the material selection thereof. In some embodiments, the material of the connection wire 105*b* includes copper.

The specific structures of the first pin 01 and the second pin 02 are not limited. As shown in FIG. 2*a* and FIG. 2*b*, in some embodiments, the first pin 01 includes: a first transmission sub-layer 01*a* located in the first gate metal layer 115*a*, and a second transmission sub-layer 01*b* located in the data metal layer 116 and connected to the first transmission sub-layer 01*a* through a via hole, wherein the second pin 02 is a single-layer transmission portion located in the data metal layer 116. In addition, the internal pin 106 connecting the first bonding portion 10*a* and the second bonding portion 10*b* is also located in the data metal layer 116. In order to simplify the manufacturing process, the first lead wire 11*a* and the third lead wire 13*a* are arranged in the first gate metal layer 115*a*, and manufactured and connected with the first transmission sub-layer of each first pin 01 in the same layer.

As mentioned above, since the second lead wire 11*b* and the fourth lead wire 13*b* are arranged outside the area where the first bonding portion 10*a* is situated, the structural forms of the second lead wire 11*b* and the fourth lead wire 13*b* may be flexibly selected. For example, the second lead wire 11*b* and the fourth lead wire 13*b* are located in the first gate metal layer 115*a*, or the second lead wire 11*b* and the fourth lead wire 13*b* are located in the second gate metal layer 115*b*, or the second lead wire 11*b* and the fourth lead wire 13*b* both include two stacked sub-layers which are respectively located in the first gate metal layer 115*a* and the second gate metal layer 115*b*, and so forth. In some embodiments, the second lead wire 11*b* and the fourth lead wire 13*b* are located in the second gate metal layer 115*b*, the second lead wire 11*b* is connected to the first connection pin 101*b* through a via hole, and the fourth lead wire 13*b* is connected to the second connection pin 102*b* through a via hole.

Figure 3:
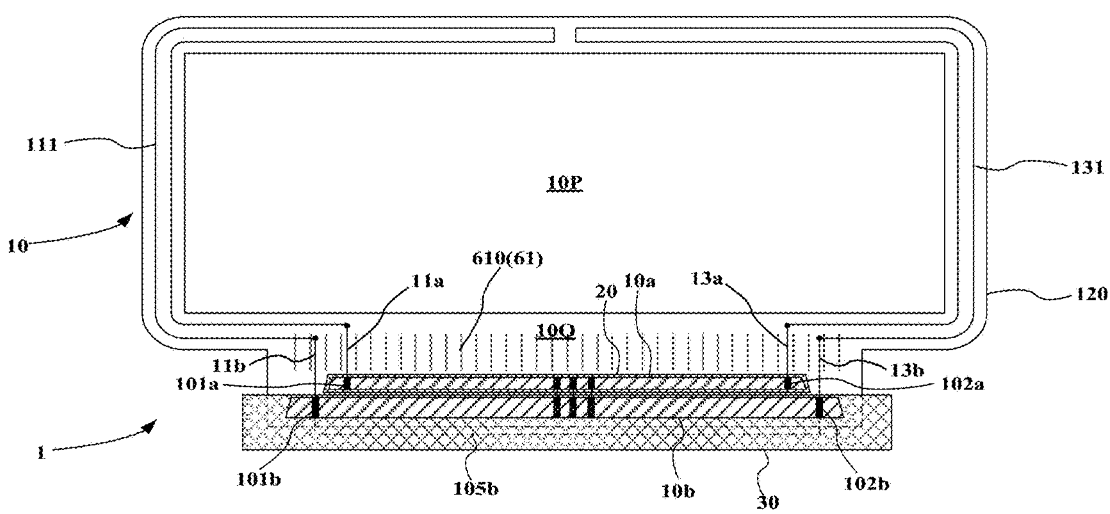
FIG. 3 is a front view of a display panel according to another embodiment of the present disclosure.

As shown in FIG. 3, in some embodiments of the present disclosure, the substrate 120 is a flexible substrate, the display area 10P is substantially polygonal, and the first bonding portion 10*a* is adjacent to one side of the display area 10P; the display substrate 10 also includes a bending portion 61 located on one side of the substrate 120 and located between the display area 10P and the first bonding portion 10*a*. The bending portion 61 includes a plurality of dummy wires 610 arranged at intervals and substantially perpendicular to the side. The plurality of dummy wires 610 are located in the data metal layer 116 described previously. An orthographic projection of any one of the first lead wire 11*a*, the second lead wire 11*b*, the third lead wire 13*a*, and the fourth lead wire 13*b* on the substrate is located between orthographic projections of two adjacent dummy wires 610 on the substrate 120. In addition, in other embodiments of the present disclosure, at least one of the first lead wire, the second lead wire, the third lead wire, and the fourth lead wire may also be located outside an area where the foregoing plurality of dummy wires are situated.

When the display panel 1 of this embodiment is applied to a display device, the first bonding portion 10*a* and the second bonding portion 10*b* are required to be folded toward a back side of the display substrate 10 by means of the bending portion 61, so that the IC 20 and the circuit board 30 are fixed on a back side of the display substrate 10. The plurality of dummy wires 610 arranged at intervals and substantially perpendicular to the side may improve the bending flexibility so that the layer structure thereof is less likely to break. In some embodiments of the present disclosure, the plurality of dummy wires 610 are located in the aforementioned data metal layer 116. The material of the data metal layer 116 may be titanium aluminum titanium or molybdenum aluminum molybdenum, and the like, which has a favorable ductility, so that the bending portion 61 has a better bending flexibility.

The orthographic projection of any one of the first lead wire 11*a*, the second lead wire 11*b*, the third lead wire 13*a*, and the fourth lead wire 13*b* on the substrate 120 is located between orthographic projections of two adjacent dummy wires 610 on the substrate 120. In this way, the first lead wire 11*a*, the second lead wire 11*b*, the third lead wire 13*a*, and the fourth lead wire 13*b* may be protected by the dummy wires 610, so that it is not likely to break due to bending, thereby improving the reliability of the crack detection circuit.

Figure 2C:
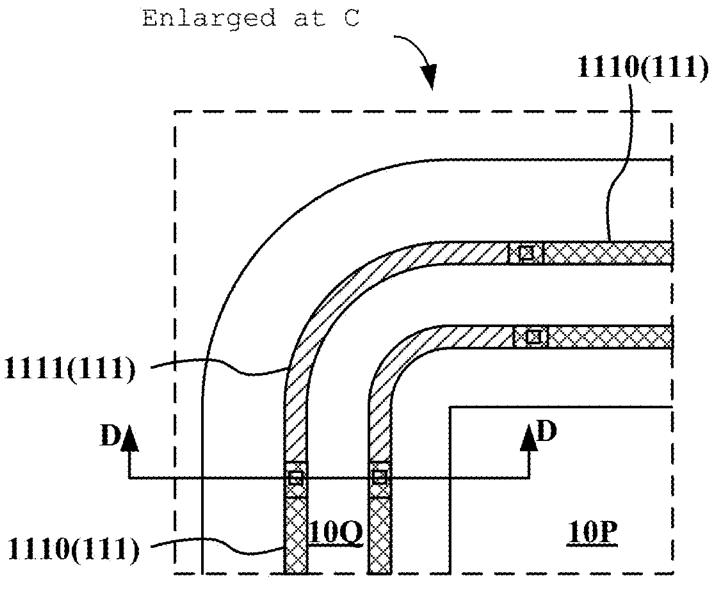
FIG. 2*c* is a partially enlarged schematic view of C of the display panel shown in FIG. 1.
Figure 2D:
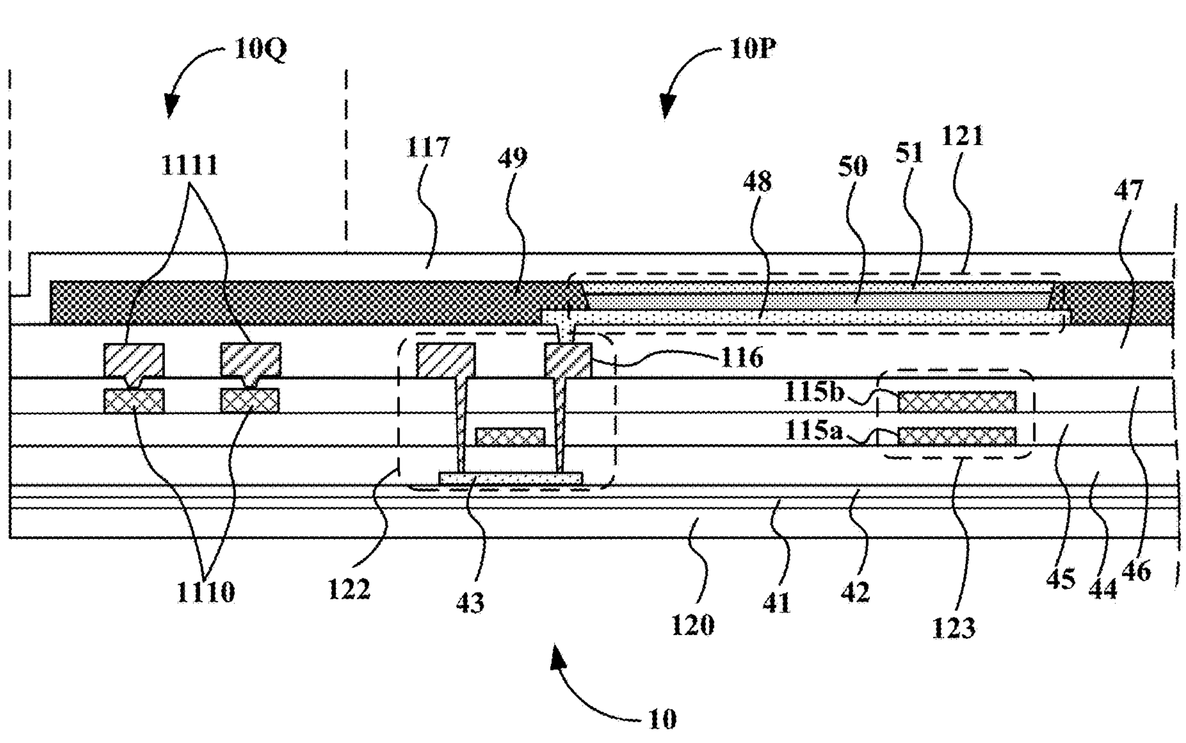
FIG. 2*d* is a schematic cross-sectional view taken along a D-D direction in FIG. 2*c;*

As shown in FIGS. 2*c* and 2*d*, in some embodiments of the present disclosure, each of the first crack detection line 111 and the second crack detection line 131 includes a plurality of first detection sections 1110 and a plurality of second detection sections 1111 that are alternately connected, wherein the first detection section 1110 is located in the second gate metal layer 115*b*, the second detection section 1111 is located in the data metal layer 116, and the first detection section 1110 and the second detection section 1111 are connected through a via hole.

The inventors of the present disclosure have noticed that, during the production and transport process of the display panel or the display device, if the trace extends continuously in the same metal layer over an excessive length, it is very likely to be subjected to electrostatic breakdown. In the above-described embodiments of the present disclosure, each of the first crack detection line 111 and the second crack detection line 131 includes a plurality of first detection sections 1110 and a plurality of second detection sections 1111 that are alternately connected and in different layers, and the adjacent first detection section 1110 and second detection section 1111 are connected through a via hole, so that it is possible to effectively reduce the possibility that the crack detection line is subjected to electrostatic breakdown.

The inventors of the present disclosure have also noticed that, due to shape characteristics of the corner area of the display panel, point discharge occurs more likely due to accumulated electrostatic charge, which results in that the trace is subjected to electrostatic breakdown. In some embodiments of the present disclosure, at least one second detection section 1111 is adjacent to the corner of the display area 10*p*. In this way, it is possible to reduce or even avoid the possibility that the crack detection line is subjected to electrostatic breakdown in the corner area. In addition, the structural design of this embodiment also makes the structures of the first crack detection line 111 and the second crack detection line 131 in the corner area more sensitive to a crack stress, so that it is more likely to be damaged or destroyed by a crack stress. Therefore, it is possible to further improve the sensitivity and accuracy of crack detection.

In the embodiment shown in FIGS. 2*c* and 2*d*, the first detection section 1110 is located in the second gate metal layer 115*b*, and the second detection section 1111 is located in the data metal layer 116. In the structure of the display substrate 10, the total thicknesses of the insulation layers on both sides of the second gate metal layer 115*b* are substantially the same. The first detection section 1110 with a relatively larger length percentage is arranged in the second gate metal layer 115*b*. In this way, the first detection section 1110 has substantially the same sensitivity to a stress caused by break of the insulation layer break on either side, so that it is possible to more accurately reflect a crack condition, thereby facilitate more improving the accuracy of crack detection.

As shown in FIG. 1, in some embodiments of the present disclosure, the first crack detection line 111 surrounding the first portion of edges of the display area 10*p* is in a roundabout shape, and the second crack detection line 131 surrounding the second portion of edges of the display area 10*p* in a roundabout shape. Such design may significantly increase a total length of the crack detection line within a limited trace area. In the vicinity of the same position, as long as crack or break occurs in any section thereof, the IC 20 may determine that there is a crack on an edge of the display substrate 10. Therefore, the sensitivity and accuracy of detection are further improved.

The lengths of the first crack detection line 111 and the second crack detection line 131 and the roundabout design form used which are not limited, may be designed according to a frame size condition of the display device. For example, in the embodiment shown in FIG. 1, taking into account a narrow frame effect of the display device as an example, the first crack detection line 111 includes two first detection sections 111*a* and one first connection section 111*b*, wherein the orthographic projections of the two first detection sections 111*a* on the substrate 120 are arranged at intervals. The second crack detection line 131 includes two second detection sections 131*a* and one second connecting section 131*b*, wherein the orthographic projections of the two second detection sections 131*a* on the substrate 120 are arranged at intervals.

Figure 4:
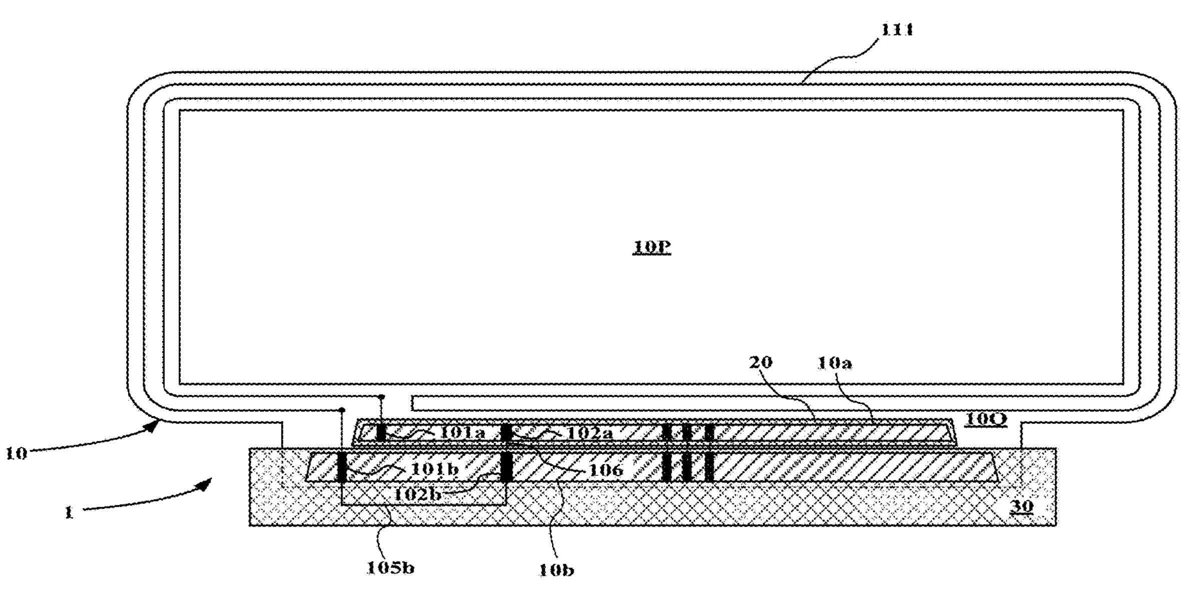
FIG. 4 is a front view of a display panel according to another embodiment of the present disclosure.

As shown in FIG. 4, in other embodiments of the present disclosure, the first connection line includes a first crack detection line 111 that surrounds at least a portion of edges of the display area 10P, and the second connection line is an internal pin 106 connecting the second detection pin 102*a* to the second connection pin 102*b*. The greater the length of an edge of the display area 10P surrounded by the first crack detection line 111 is, the higher the accuracy of detecting a crack on an edge of the display substrate 10 by the IC 20 will be.

Figure 5:
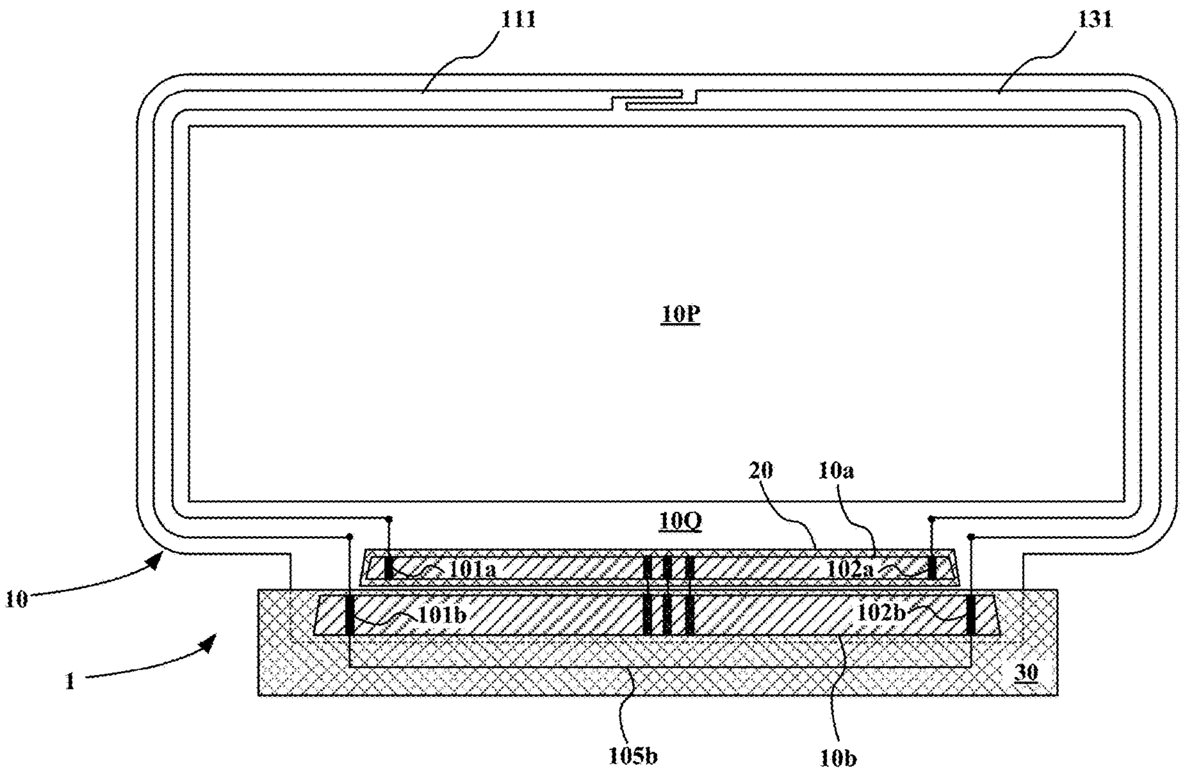
FIG. 5 is a front view of a display panel according to still another embodiment of the present disclosure.

As shown in FIG. 5, in still other embodiments of the present disclosure, the first connection line includes a first crack detection line 111 surrounding the first portion of edges of the display area 10P, and the second connection line includes a second crack detection line 131 surrounding the second portion of edges of the display area 10P, wherein the first portion of edges partially overlaps with the second portion of edges of the display area 10P. This embodiment further increases a length of an edge of the display area 10P surrounded by the crack detection line, thereby further improving the accuracy of detecting a crack on an edge of the display substrate 10 by the IC 20.

Figure 6:
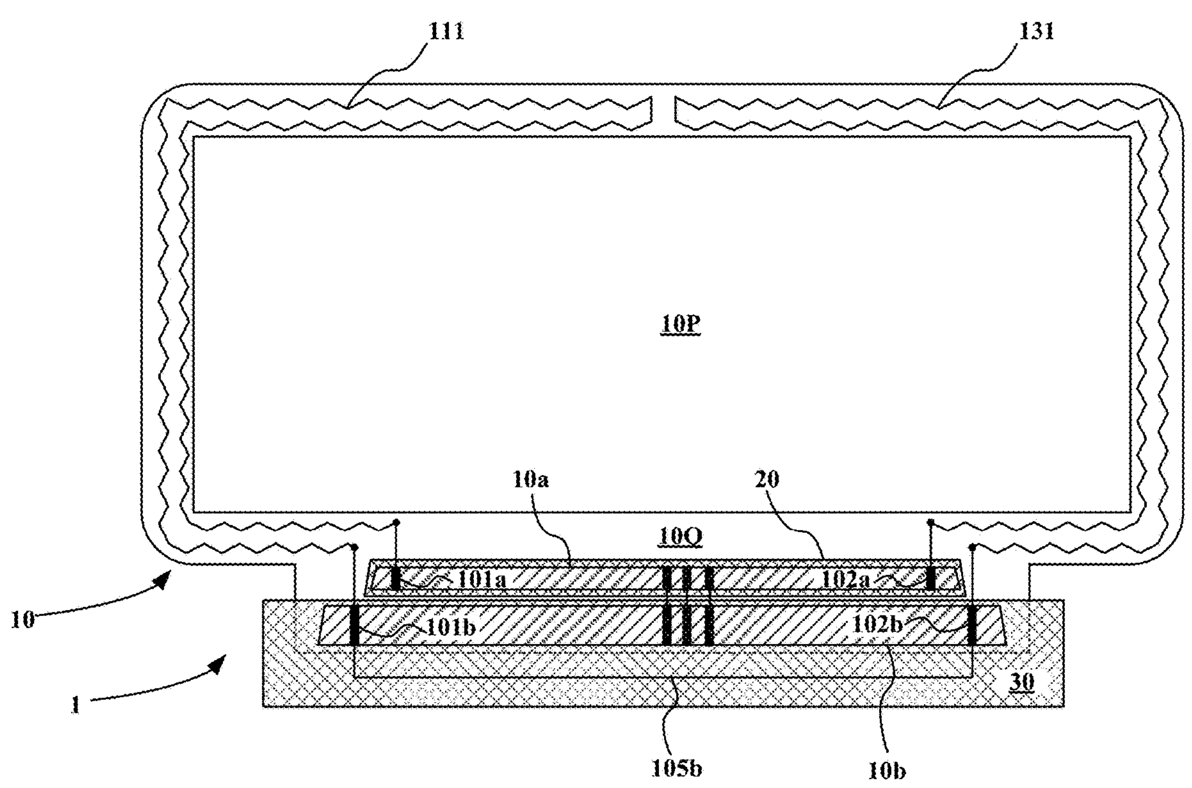
FIG. 6 is a front view of a display panel according to still another embodiment of the present disclosure.

As shown in FIG. 6, in some embodiments of the present disclosure, at least a portion of the first crack detection line 111 extends in a wave form, for example, in a zigzag wave or curved wave form. At least a portion of the second crack detection line 131 extends in a wave form, for example, in a zigzag wave or curved wave form. With this design, it is also possible to increase lengths of the first crack detection line 111 and the second crack detection line 131 within the respective limited trace areas, thereby further improving the sensitivity and accuracy of detecting a crack on an edge of the display substrate 10 by the IC 20.

In some embodiments of the present disclosure, the lengths of the first crack detection line 111 and the second crack detection line 131 are substantially equal. In this way, the probability that a crack on an edge of the display substrate 10 is detected by a crack or break of the first crack detection line 111 is substantially equal to the probability that a crack on an edge of the display substrate 10 is detected by a crack or break of the second crack detection line 131. Moreover, it is also convenient to design and manufacture the traces of the first crack detection line 111 and the second crack detection line 131. The lengths of the first crack detection line 111 and the second crack detection line 131 are substantially equal, and it may be understood that: the difference between the lengths of the first crack detection line 111 and the second crack detection line 131 is within a certain error range.

Figure 7:
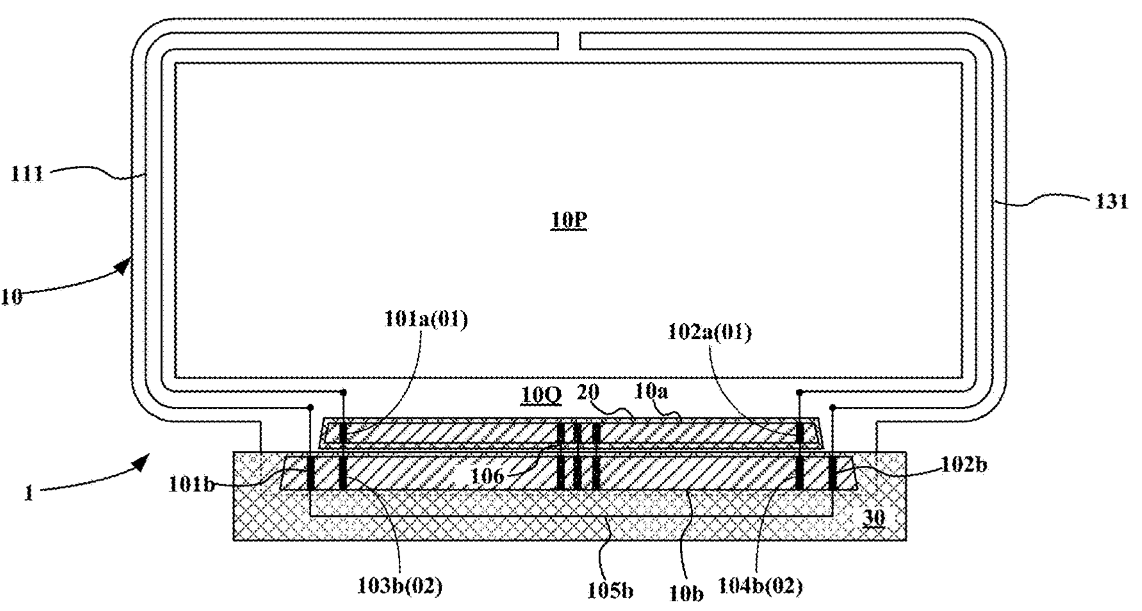
FIG. 7 is a front view of a display panel according to still another embodiment of the present disclosure.

As shown in FIG. 7, in some embodiments of the present disclosure, the plurality of second pins 02 of the second bonding portion 10*b* further includes a first external test pin 103*b* and a second external test pin 104*b*. The first external test pin 103*b* is connected to the first detection pin 101*a* through an internal pin 106, and the second external test pin 104*b* is connected to the second detection pin 102*a* through an internal pin 106. During the manufacturing process of the display substrate 10, it is necessary to test whether the crack detection circuit is qualified. The first external test pin 103*b* and the second external test pin 104*b* are configured to be in external contact with a probe of a voltmeter. By detecting the voltages of the first external test pin 103*b* and the second external test pin 104*b*, it may be determined whether the IC 20 is in normal operation in the crack detection circuit.

Figure 8:
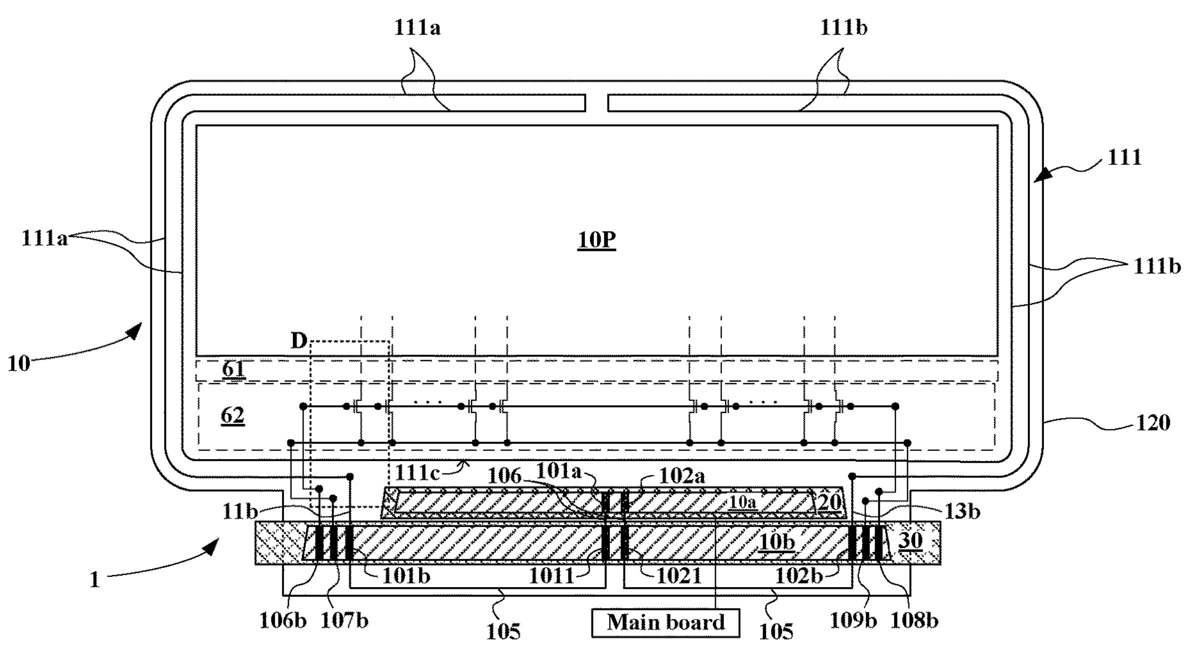
FIG. 8 is a front view of a display panel according to one embodiment of the present disclosure.
Figure 9:
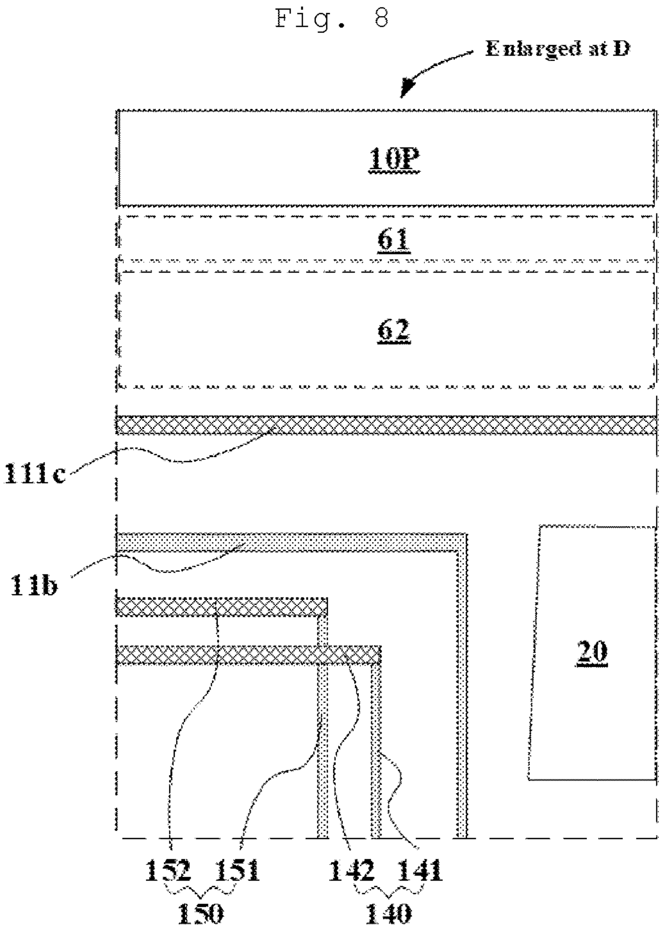
FIG. 9 is a partially enlarged schematic view of D of the display panel shown in FIG. 8.

FIG. 8 is a front view of a display panel according to one embodiment of the present disclosure. FIG. 9 is a partially enlarged schematic view of D of the display panel shown in FIG. 8.

Referring to FIGS. 8 and 9, the display panel 1 provided by an embodiment of the present disclosure includes: a display substrate 10, an integrated circuit chip 20 (IC) and a circuit board 30. The display substrate 10 includes a display area 10P and a non-display area 10Q surrounding the display area 10P. The display substrate 10 includes a substrate 120, and a first bonding portion 10*a*, a second bonding portion 10*b*, and a first connection line, which are located on one side of the substrate 120 and located in the non-display area 10Q.

The first bonding portion 10*a* includes a plurality of first pins 01 including a first detection pin 101*a* and a second detection pin 102*a*. The second bonding portion 10*b* is located on one side of the first bonding portion 10*a* away from the display area 10P. The second bonding portion 10*b* includes a plurality of second pins 02 including a first connection pin 101*b* and a second connection pin 102*b*. The first detection pin 101*a* is electrically connected to the first connection pin 101*b*, and the second detection pin 102*a* is electrically connected to the second connection pin 102*b*.

The first connection line connects the first connection pin 101*b* to the second connection pin 102*b*, and includes a first crack detection line 111 arranged around at least a portion of edges of the display area 10P. The integrated circuit chip 20 is bonded to the first bonding portion 10*a*, and configured to drive the display substrate 10 to display according to a signal of a main board, and determine whether there is a crack on an edge of the substrate 10 according to electrical signals of the first detection pin 101*a* and the second detection pin 102*a*. The circuit board 30 is bonded to the second bonding portion 10*b* for transmitting a signal of the main board to the IC 20.

In this embodiment, the first detection pin 101*a* and the second detection pin 102*a* of the first bonding portion 10*a* are electrically connected with the first connection pin 101*b* and the second connection pin 102*b* of the second bonding portion 10*b*, respectively, without being directly connected with the first crack detection line 111, so that different integrated circuit chips can be adapted to the first crack detection line 111 through the circuit design of the circuit board 30, and the adaptability of crack detection of the display panel to the integrated circuit chips 20 can be improved.

Referring to FIG. 8, the second bonding portion 10*b* further includes a third connection pin 1011 and a fourth connection pin 1021, wherein the third connection pin 1011 is connected with the first detection pin 101*a* through an internal pin 106 and connected with the first connection pin 101*b* through a connecting wire 105, and the fourth connection pin 1021 is connected with the second detection pin 102*a* through an internal pin 106 and connected with the second connection pin 102*b* through a connecting wire 105. By arranging the internal pin 106 and the connecting wire 105, it is easier for the first connecting pin 101*b* and the second connecting pin 102*b* to set their positions according to specific needs.

In some embodiments, the first connection pin 101*b* and the second connection pin 102*b* are respectively located at end regions on both sides of the second bonding portion 10*b*, and the third connection pin 1011 and the fourth connection pin 1021 are both located between the first connection pin 101*b* and the second connection pin 102*b*. The first connection pin 101*b* and the second connection pin 102*b* are respectively arranged at the two end regions of the second bonding portion 10*b*, so that the first connection pin 101*b* and the second connection pin 102*b* can be conveniently connected with the first crack detection line located around the display area.

In FIG. 8, the connecting wire 105 is independently arranged relative to the circuit board 30. This can reduce the interference between the connecting wire 105 and the internal circuit of the circuit board 30, and improve the accuracy of panel control and performance test.

Referring to FIGS. 8 and 9, in some embodiments, The display panel further includes a cell test (CT) circuit 62. The cell test circuit 62 is located between the display area 10*p* and the integrated circuit chip 20. An interval region is provided between the cell test circuit 62 and the integrated circuit chip 20 in a direction away from the display area 10*p*. The first crack detection line 111 includes a first detection portion 111*c* passing through the interval region.

The first detection portion 111*c* passes through an interval region between the cell test circuit 62 and the integrated circuit chip 20 with fewer lines, which is beneficial to reduce the mutual interference between the first crack detection line 111 and other components and wires.

In FIGS. 8 and 9, the cell test circuit 62 can be connected with a plurality of test pins 106*b*, 107*b*, 108*b* and 109*b* (e.g., control lines or data lines) located in the second bonding portion 10*b* through lead wires 140 and 150. Referring to the structure of the display substrate 10 shown in FIGS. 2*a* and 2*d*, the lead wire 140 may include a lead wire segment 142 located in the data metal layer and a lead wire segment 141 located in the first gate metal layer 115*a* or the second gate metal layer 115*b*, and the lead wire 150 may include a lead wire segment 152 located in the data metal layer and a lead wire segment 151 located in the first gate metal layer 115*a* or the second gate metal layer 115*b*.

In FIGS. 8 and 9, the first crack detection line 111 further includes a second detection portion 111*d* arranged around a first portion of edges of the display area 10P and a third detection portion 111*e* arranged around a second portion of edges of the display area 10P, the first portion of edges does not overlap with the second portion of edges or partially overlap with the second portion of edges, and the second detection portion 111*d* and the third detection portion 111*e* are respectively connected with both ends of the first detection portion 111*c* on opposite sides of the interval region.

Referring to FIG. 8, in some embodiments, the second detection portion 111*d* surrounding the first portion of edges of the display area 10P is in a roundabout shape; and/or, the third detection portion 111*e* surrounding the second portion of edges of the display area 10P is in a roundabout shape. Optionally, at least a portion of the first crack detection line 111 extends in a wave form. For example, at least one of the first detection portion 111*c*, the second detection portion 111*d*, and the third detection portion 111*e* extends in a wave form. Optionally, the second detection portion 111*d* and the third detection portion 111*e* have substantially the same length.

Referring to the structure of the display substrate 10 shown in FIGS. 2*a* and 2*d*, the first detection portion 111*c* may be located in the data metal layer 116. By arranging the first detection portion 111*c* of the first crack detection line 111 in the data metal layer 116, the crosstalk between the first detection portion 111*c* and the lead-out wires of the integrated circuit chip 20 located in the first gate metal layer 115*a* and the second gate metal layer 115*b* at the lower side thereof can be reduced.

Referring to FIGS. 8 and 9, in some embodiments, the substrate 120 is a flexible substrate, the display area 10P is substantially polygonal, and the first bonding portion 10*a* is adjacent to one side of the display area. The display substrate further includes a bending portion 61 located on one side of the substrate 120 and between the display area 10P and the cell test circuit 62. By folding the bending portion 61, the cell test circuit 62, the integrated circuit chip 20 and the circuit board 30 can be fixed on the back side of the display substrate 10.

In FIG. 8, the first connection line includes a second lead wire 11*b* connecting one end of the first crack detection line 111 to the first connection pin 101*b*, and a fourth lead wire 13*b* connecting another end of the first crack detection line 111 to the second connection pin 102*b*. The orthographic projections of the second lead wire 11*b* and the fourth lead wire 13*b* do not overlap with an orthographic projection of the first bonding portion 10*a* on the substrate 120.

Figure 10:
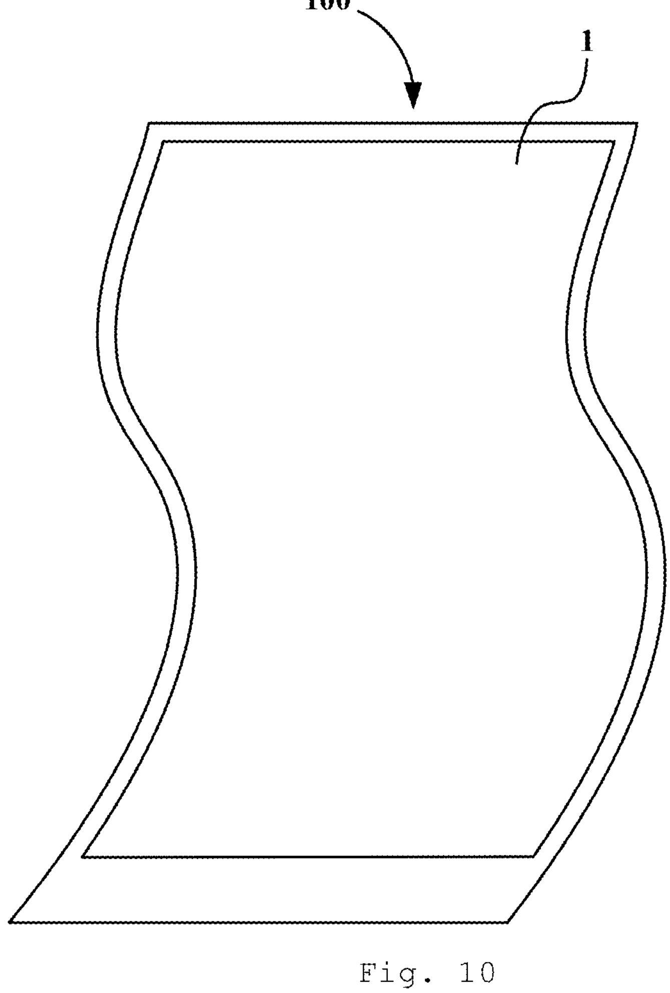
FIG. 10 is a schematic view of a display device according to one embodiment of the present disclosure.

As shown in FIG. 10, the embodiments of the present disclosure also provide a display device 100 including the display panel 1 of any one of the foregoing embodiments. In the embodiment shown in FIG. 10, the display device is a display device including a bendable flexible display panel. In other embodiments of the present disclosure, the display device may also be a display device including a flat display panel, or a display device including a curved display panel. The display device, which is not limited to a specific product type, may be, for example, a display, a computer, a television, a mobile phone, a wearable device, electronic paper, or a display screen and the like.

As described previously, since defective products with a crack on an edge may be screened out during the production stage of the display panel, the display device has a high product quality.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display panel, comprising:

a display substrate comprising a display area and a non-display area surrounding the display area, wherein the display substrate comprises a substrate, as well as a first bonding portion, a second bonding portion, and a first connection line, which are located on one side of the substrate and located in the non-display area, wherein:

the first bonding portion comprises a plurality of first pins comprising a first detection pin and a second detection pin;

the second bonding portion is located on one side of the first bonding portion away from the display area, the second bonding portion comprises a plurality of second pins comprising a first connection pin and second connection pin, the first detection pin is electrically connected to the first connection pin, and the second detection pin is electrically connected to the second connection pin;

the first connection line connects the first connection pin to the second connection pin, and comprises a first crack detection line arranged around at least a portion of edges of the display area, wherein one end of the first crack detection line is connected to the first detection pin via the first connection pin, and the other end of the first crack detection line is connected to the second detection pin via the second connection pin; and an integrated circuit chip bonded to the first bonding portion, and configured to drive the display substrate to display according to a signal of a main board, and to determine whether there is a crack on an edge of the display substrate according to electric signals of the first detection pin and the second detection pin; and a circuit board bonded to the second bonding portion and configured to transmit a signal of the main board to the integrated circuit chip.

2. The display panel according to claim 1, wherein the second bonding portion further comprises a third connection pin and a fourth connection pin, wherein the third connection pin is connected with the first detection pin through an internal pin and connected with the first connection pin through a connecting wire, and the fourth connection pin is connected with the second detection pin through an internal pin and connected with the second connection pin through a connecting wire.

3. The display panel according to claim 2, wherein the first connection pin and the second connection pin are respectively located at end regions on both sides of the second bonding portion, and the third connection pin and the fourth connection pin are both located between the first connection pin and the second connection pin.

4. The display panel according to claim 2, wherein the connecting wire is independently arranged relative to the circuit board.

5. The display panel according to claim 1, further comprises:

cell test circuit, located between the display area and the integrated circuit chip, wherein an interval region is provided between the cell test circuit and the integrated circuit chip in a direction away from the display area, and the first crack detection line comprises a first detection portion passing through the interval region.

6. The display panel according to claim 5, wherein the first crack detection line further comprises a second detection portion arranged around a first portion of edges of the display area and a third detection portion arranged around a second portion of edges of the display area, the first portion of edges does not overlap with the second portion of edges or partially overlap with the second portion of edges, and the second detection portion and the third detection portion are respectively connected with both ends of the first detection portion on opposite sides of the interval region.

7. The display panel according to claim 5, wherein the display substrate comprises: a semiconductor layer, a first insulation layer, a first gate metal layer, a second insulation layer, and a second gate metal layer, a third insulation layer and a data metal layer located on one side of the substrate and arranged sequentially along a direction away from the substrate; and the first detection portion is located in the data metal layer.

8. The display panel according to claim 5, wherein the substrate is a flexible substrate, the display area is substantially polygonal, and the first bonding portion is adjacent to one side of the display area;

the display substrate further comprises a bending portion located on one side of the substrate and between the display area and the cell test circuit.

9. The display panel according to claim 1, wherein:

the first connection line comprises a second lead wire connecting one end of the first crack detection line to the first connection pin, and a fourth lead wire connecting another end of the first crack detection line to the second connection pin, wherein orthographic projections of the second lead wire and the fourth lead wire do not overlap with an orthographic projection of the first bonding portion on the substrate.

10. The display panel according to claim 9, wherein:

the display substrate comprises: a semiconductor layer, a first insulation layer, a first gate metal layer, a second insulation layer, and a second gate metal layer, a third insulation layer and a data metal layer located on one side of the substrate and arranged sequentially along a direction away from the substrate;

the first pin comprises: a first transmission sub-layer located in the first gate metal layer, and a second transmission sub-layer located in the data metal layer and connected to the first transmission sub-layer through a via hole; and the second pin comprises a single-layer transmission portion located in the data metal layer.

11. The display panel according to claim 10, wherein:

the second lead wire and the fourth lead wire are located in the second gate metal layer, the second lead wire is connected to the first connection pin through a via hole, and the fourth lead wire is connected to the second connection pin through a via hole.

12. The display panel according to claim 10, wherein the first crack detection line comprises a plurality of first detection sections and a plurality of second detection sections that are alternately provided, wherein each of the plurality of first detection sections is located in the second gate metal layer, each of the plurality of second detection sections is located in the data metal layer, and each first detection section is connected to a respective second detection section through a via hole.

13. The display panel according to claim 12, wherein the display area is substantially polygonal, the first bonding portion is adjacent to one side of the display area, and at least one of the plurality of second detection sections is adjacent to a corner of the display area.

14. The display panel according to claim 10, wherein:

the second bonding portion is connected to the first bonding portion by a plurality of internal pins which are located in the data metal layer;

the plurality of second pins further comprise a first external test pin and a second external test pin, wherein the first external test pin is connected to the first detection pin through one internal pin, and the second external test pin is connected to the second detection pin through one internal pin.

15. The display panel according to claim 6, wherein:

the second detection portion surrounding the first portion of edges of the display area is in a roundabout shape; and/or, the third detection portion surrounding the second portion of edges of the display area is in a roundabout shape.

16. The display panel according to claim 15, wherein at least a portion of the first crack detection line extends in a wave form.

17. The display panel according to claim 6, wherein the second detection portion and the third detection portion have substantially a same length.

18. A display device comprising the display panel according to claim 1.

* * * * *